United States Patent
Salinas

(10) Patent No.: US 6,646,883 B2
(45) Date of Patent: Nov. 11, 2003

(54) INSERTION LATCH AND EJECTABLE PULL HANDLE FOR RACK MOUNTED ELECTRONIC DEVICES

(75) Inventor: Everett R. Salinas, Pasadena, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 177 days.

(21) Appl. No.: 09/934,269

(22) Filed: Aug. 21, 2001

(65) Prior Publication Data

US 2003/0039100 A1 Feb. 27, 2003

(51) Int. Cl.[7] .................................................. G06F 1/16
(52) U.S. Cl. ........................ 361/727; 361/724; 361/752; 361/754; 16/422; 211/26
(58) Field of Search ............................... 361/683, 685, 361/724–727, 732, 740, 759, 801, 802; 292/114, 118, 128, 102, 107, 108, 228; 211/26, 189; 16/412, 413, 422, 438; 312/244, 223.1, 233, 223.2, 322.1; 24/458, 366, 459, 522, 371, 532, 539, 313, 540, 572, 294; 439/116–120, 136, 137

(56) References Cited

U.S. PATENT DOCUMENTS

| | | | | |
|---|---|---|---|---|
| 2,609,268 A | * | 9/1952 | Nye ........................ | 312/332.1 |
| 3,140,905 A | * | 7/1964 | Trotter et al. ............. | 312/332.1 |
| 4,931,907 A | * | 6/1990 | Robinson et al. ........... | 361/727 |
| 6,058,579 A | * | 5/2000 | Brocklesby et al. .......... | 24/459 |
| 6,094,353 A | * | 7/2000 | Koerber et al. ............. | 361/754 |
| 6,181,549 B1 | * | 1/2001 | Mills et al. ................. | 361/683 |
| 6,266,248 B1 | * | 7/2001 | Hanas et al. ................ | 361/752 |
| 6,279,755 B1 | * | 8/2001 | Bodensteiner et al. ........ | 211/26 |
| 6,374,460 B1 | * | 4/2002 | Edevold et al. .............. | 16/422 |

OTHER PUBLICATIONS

Article "Latching Mechanism", IBM Technical Disclosure Bulletin, Dec. 1958, US vol. No. 1, Issue No. 4, pp. 13–14.*

* cited by examiner

*Primary Examiner*—Michael Datskovsky

(57) ABSTRACT

The invention relates to an insertion latch for an ejectable pull handle system for installation of electronic devices into rack mounted computer systems. In particular, the invention comprises an insertion latch that has a compression member and a tension member that are compressed and placed in tension respectively when a latching head of the insertion latch is displaced. The latching head moves to its rest or latched position by a combination of forces supplied by the compression member and attention member. The insertion latch also has a leaf spring mounted through a channel of a mounting portion of the insertion latch. The leaf spring contacts a force application surface on the ejectable pull handle and biases that ejectable pull handle toward an intermediate position. The force application surface of the ejectable pull handle is preferably semi-circular such that the force applied by the leaf spring is directed, for the most part, tangentially to the rotation of the ejectable pull handle, regardless of the position of that handle.

30 Claims, 4 Drawing Sheets

INSERTION LATCH AND EJECTABLE PULL HANDLE FOR RACK MOUNTED ELECTRONIC DEVICES

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The present invention relates generally to insertion and removal of electronic devices from rack mounted systems. More particularly, the preferred embodiments of the present invention relate to an insertion latch and ejectable pull handle for rack mounted electronic devices. More particularly still, the preferred embodiments of the present invention relate to a handle for electronic devices mounted in a rack system that uses mechanical advantage to supply necessary insertion and removal force, and an insertion latch that holds the ejectable pull handle in a latched position.

2. Background of the Invention

In locations where many computers or electronic devices need to be mounted in a relatively small location, rack mounted systems have been the standard. In a rack mounted system, a plurality of devices may be mounted in the rack generally, and further a plurality of devices may be mounted at each elevation within the rack. These racks typically have a backplane board across a back surface that has one or more electrical connectors. Likewise, the computers or electronic devices that are attached in these rack mounted systems typically electrically couple to each other and to external systems through the electrical connectors mounted on the backplane boards.

Insertion and removal of the electronic devices in early rack mounted systems required significant force, both for removal of the device as well as insertion. With regard to insertion of the electronic devices, the prior art technique was to slide the computer or electronic device into the rack until corresponding pins or a card edge of the electronic device met with the corresponding connector. Once that initial contact was made, or slightly before, the technician or operator then applied an impulse force, e.g., slamming or hitting the electronic device, to supply the necessary force to slide the pins or card edge into the mating connector on the backplane board. Once installed in this manner, the electronic device was typically held in place by screws, knurled knobs or some other locking mechanism to ensure that the electrical connections were not de-coupled, e.g., because of mechanical vibration. Likewise for removal, the operator or technician unlocked or de-latched the mechanism present to hold the electronic device in place, and then supplied significant impulse removal force, e.g., yanked on the electronic device, to overcome the forces tending to hold the card edge or pins within the mating connector.

Significant strides were made in the prior art with the introduction of handles that use mechanical advantage to both insert and remove electronic devices from their backplane board connections. Referring now to FIG. 1, there is shown an electronic device 2 with its card edge connector 4 proximate to a backplane board connector 6. Rather than slamming the electronic device 2 such that the card edge connector 4 mates with the connector 6, as was the early technique, more modern prior art techniques use the mechanical advantage of the handle 8 for insertion and removal. In particular, the handle 8 has a rack hook 10 which couples to the rack into which the electronic device 2 is to be installed. The handle 8 rotates about a pivot point 12 as indicated by the arrows in FIG. 1. Thus, an operator pushing on the handle portion 14 has mechanical advantage because of the greater distance from the handle 14 to the pivot point as compared to the rack hook 10 to the pivot point. Referring now to FIG. 2, there is shown the electronic device 2 with its card edge connector 4 (shown in dashed lines) within the connector 6. However, having now used the mechanical advantage of the handle 8 to insert the electronic device 2, something must be done with the handle 8 to hold it in place. That is, when the electronic device 2 is in the inserted position, there may be some play in the handle which allows it to fall slightly out of place. Not only does this clutter the front of the electronic device, but also may contribute to the electronic device becoming unseated.

Prior art techniques for holding the handle 8 in place involved latching the handle in a latched position by use of the latching area 16 of the handle 8. Because the structure that mates with the latching area 16 must be capable of horizontal displacement to allow the latch 8 to be rotated for removal of the electronic device, prior art devices involved a complicated conglomeration of coil springs and movable parts. While the prior art devices may do the job of holding the handle 8 in the latched position, their complexity to build and repair make them undesirable.

Thus, what is needed in the art is an insertion latch mechanism that does not use the coil springs and complicated moving parts common in the prior art. Such a system should be relatively simple, have few moving parts, and should be easy to install and remove.

BRIEF SUMMARY OF THE INVENTION

The problems noted above are solved in large part by an insertion latch and ejectable pull handle system. The insertion latch of the preferred embodiment has a mounting portion that securely attaches to the electronic device. By securely attaching, substantially no rotation is allowed of the mounting portion of the insertion latch. The insertion latch also comprises a latching head adapted to mate with a latching area of the ejectable pull handle. This latching head thus holds the ejectable pull handle in a latched position when the electronic device is installed in the rack. Between the latching head and the mounting portion is a flexible arm comprising a compression member and a tension member. In a latched or rest position, the compression member is not compressed, and the tension member is not under tension; however, when the latching head is displaced, the compression member is placed in compression and the tension member is placed in tension. These two members, acting in combination, provide the necessary restoring force for the latching head once the displacing force has been removed. Displacing of the latching head takes place either by an operator or technician pushing the latching head to release the ejectable pull handle, or by actuation of a displacement arm on the ejectable pull handle during the latching operation.

The preferred embodiments of the present invention also comprise a force application surface on the ejectable pull handle, and a leaf spring securely attached to the mounting portion of the insertion latch and contacting the force application surface. The leaf spring provides the necessary force to push the ejectable pull handle to an intermediate position, such that an operator or technician can grab the handle and rotate it for removal of the electronic device. The force application surface on the ejectable pull handle is designed such that force provided by the leaf spring is directed substantially tangential to the point of rotation, regardless of the handle position.

BRIEF DESCRIPTION OF THE DRAWINGS

For a detailed description of the preferred embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function.

DETAILED DESCRIPTION OF THE PREFERRED EMBODIMENTS

Figure 1:
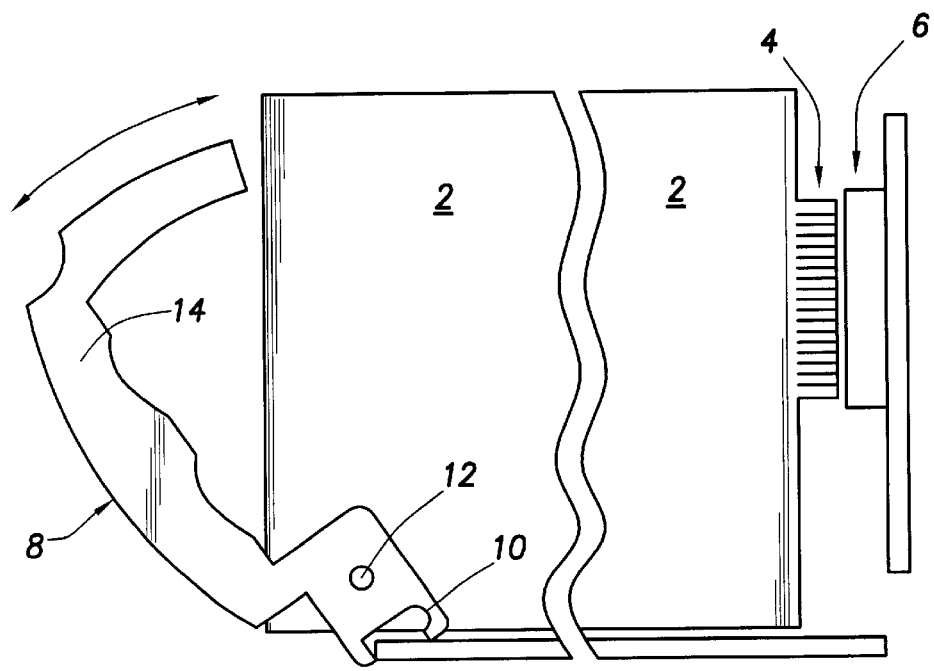
FIG. 1 shows a prior art system for insertion and removal of an electronic device, with the electronic device not having its card edge connector inserted into the mating backplane board connector.
Figure 2:
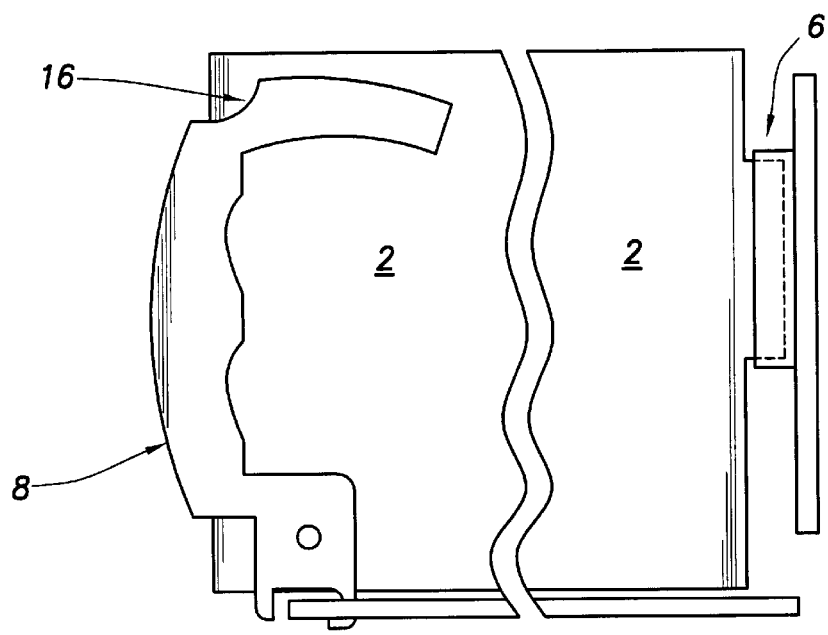
FIG. 2 shows a prior art electronic device in its inserted position.
Figure 3:
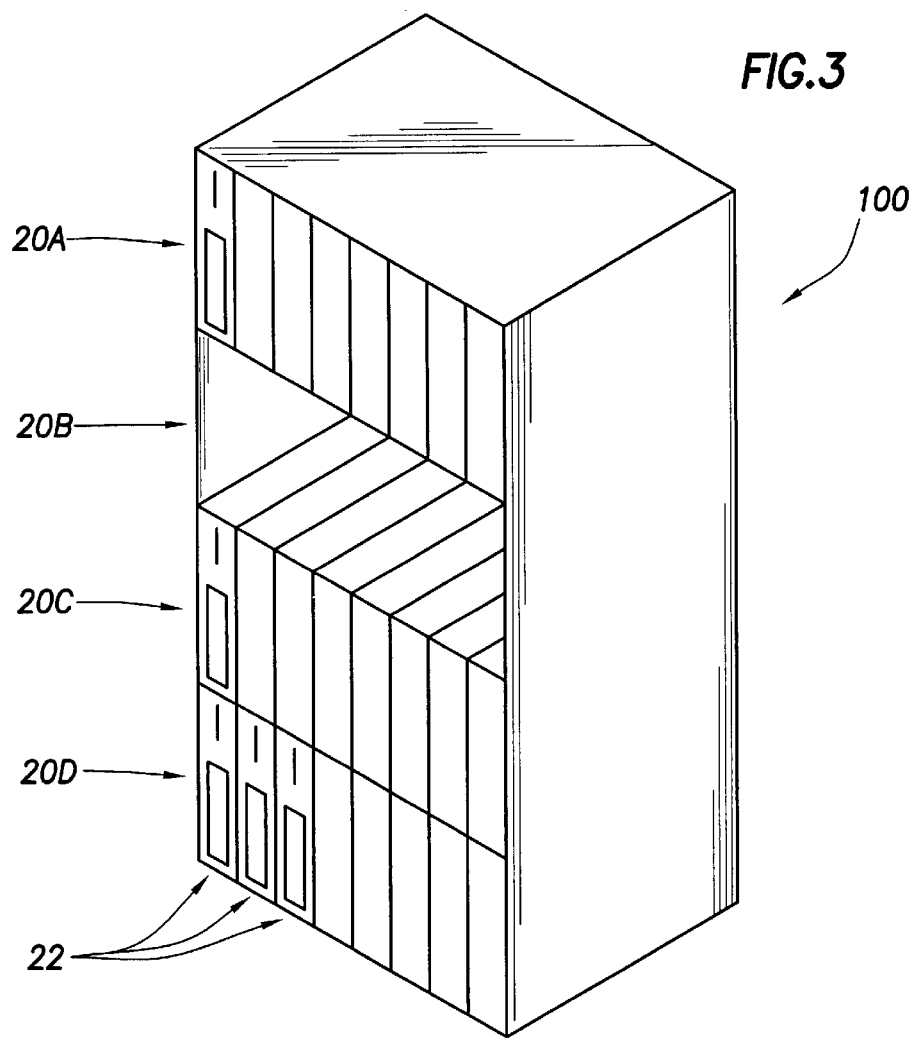
FIG. 3 shows a rack mounted system having electronic devices therein.

Referring now to FIG. 3, there is shown a rack mounted computer system 100 of the preferred embodiment. In particular, the system 100 has four racks 20A–D, and preferably within each rack there exists a plurality of electronic devices 22. It is envisioned that the electronic devices 22 could comprise any electronic device mounted in a rack system, but the preferred embodiments of the present invention are directed to rack mounted computer systems. Rack 20B of the system 100 is shown without any electronic devices 22 to exemplify that the electronic devices or computer systems 22 may be installed and removed as necessary from the system 100.

Figure 4:
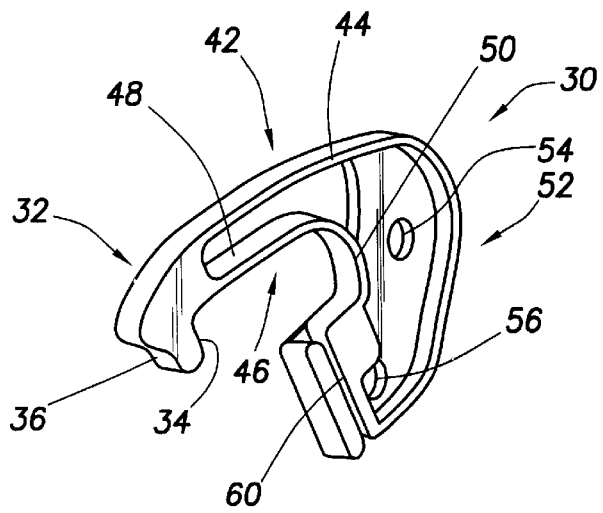
FIG. 4 shows a perspective view of the insertion latch of the preferred embodiment.

Referring now to FIG. 4, there is shown an insertion latch 30 of the preferred embodiment. The insertion latch 30 preferably comprises a latching portion or latching head 32, a flexible arm 42, and a stationary or mounting portion 52.

Figure 5:
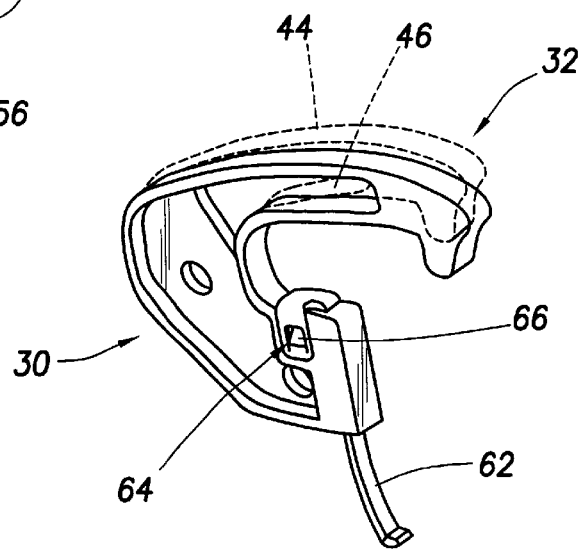
FIG. 5 shows a perspective view of the insertion latch of the preferred embodiment including the leaf spring, and in dashed lines displacement of the latching head.

The latching head 32 is designed to mate with the corresponding feature of the ejectable pull handle. In particular, the latching head 32 has a latching face 34 that preferably contacts the ejectable pull handle and holds the ejectable pull handle in a latched position. The latching head 32 also comprises a actuation portion 36 which provides a location for an operator or technician to displace the latching head 32 so as to release the ejectable pull handle. Referring briefly to FIG. 5, there is shown the latching head 32 in a displaced position (dashed lines).

Referring again to FIG. 4, the mounting portion 52 of the insertion latch 30 preferably has apertures 54 and 56 therethrough. The insertion latch 30 is preferably securely attached to the electronic device by the use of these apertures 54, 56. In particular, the insertion latch 30 is preferably held in place by a nut and bolt combination (not shown) fed through each of these apertures 54, 56. However, any suitable attaching mechanism may be used, including rivets, dow rods with cotter pins, and the like.

The flexible arm 42 preferably comprises a compression member 44 and a tension member 46. As can be seen in the drawings, the flexible arm 42 attaches the latching head 32 to the mounting base 52. In the rest or latched position, neither the compression member 44 nor the tension member 46 have significant compression or tension applied thereto (although there may be some slight compression and tension involved with holding the ejectable pull handle in the latched position). During installation of the electronic device, or when unlatching the ejectable pull handle for removal of the electronic device, the flexible arm rotates slightly to allow the latching head 32 to displace generally upward. When the latching head 32 is displaced, the compression member 44 is compressed and the tension member 46 is placed in tension. The combination of the forces applied by the compression member 44 and the tension member 46 act to return the latching head to its rest or latched position when the displacing force has been removed.

Preferably, the compression member 44 has a rectangular cross section and has a slight curvature. In the preferred embodiment, the curvature of the compression member 42 has a radius that is larger than a height H of the insertion latch 30 (see FIG. 8). In the preferred implementation, the height H is 1.75 inches. The tension member 46 preferably has a rectangular cross section, and also comprises a first section 48 and a second section 50. The first section 48 preferably has a slight curvature being substantially the same as the curvature for the compression member 44. The second section 50, however, preferably has a curvature with a radius that is smaller than the curvature of the first section 48.

Referring now to FIG. 5, there is shown the insertion latch 30 with the latching head 32 in a displaced position (dashed lines). While in this displaced position, the compression member 44 and the tension member 46 are preferably placed in compression and tension respectively. This displacement of the latching head 32 could be caused by an arm of the insertion latch (discussed more fully below), or may be caused by an operator or technician pushing the latching head to release the ejectable pull handle. Regardless of the reason for the displacement, in the displaced position the compression member and the tension member are compressed and placed in tension respectively. A release of the displacing force thus moves the latching head 32 back to its rest or latched position by a combination of force supplied by the compression member 44 and the tension member 46.

Figure 6:
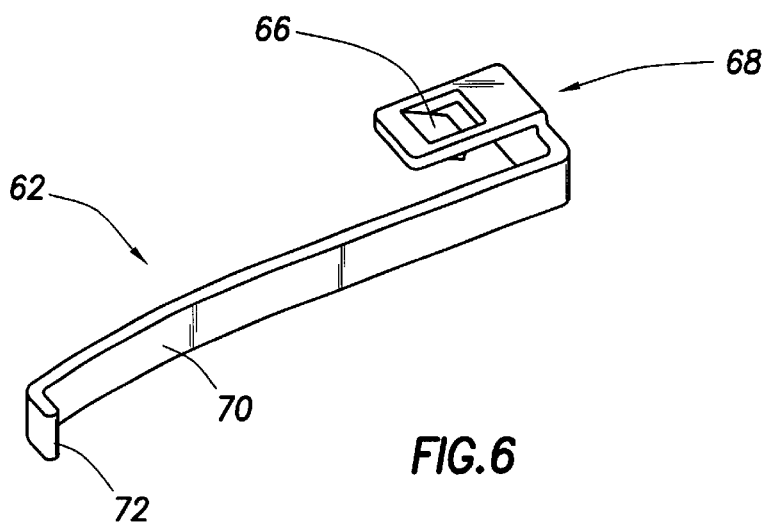
FIG. 6 shows a perspective view of the leaf spring of the preferred embodiment.

Referring again to FIG. 4, the preferred embodiment of the insertion latch 32 also comprises a channel 60 through the mounting portion 52. The direction of the channel 60 is preferably substantially parallel to the latching face 34 of the latching head 32. Referring again to FIG. 5, in the preferred embodiment a leaf spring 62 is adapted to fit within the channel 60 and extend below the insertion latch 30. The leaf spring 62 preferably provides ejection force to the ejectable pull handle, which is discussed more fully below. On a side opposite that of the channel 60, the insertion latch also preferably comprises a spring retention indentation, or spring retention cavity. The leaf spring 62 is preferably adapted to fit within the channel 60 and overlap to the opposite side of the insertion latch 30, whereupon a tab 66 of the leaf spring 62 fits within the spring retention cavity 64 to securely retain the leaf spring 62 within the channel 60. FIG. 6 shows a more detailed view of the leaf spring 62, including the tab 66 which is part of the spring retention assembly 68 (which may comprise a portion of the leaf spring in the channel 60, the portion of the leaf spring that wraps to the opposite side of the insertion latch 30, the structure around the tab, and the tab 66 itself), a spring portion 70 and a force application point 72.

Figure 7:
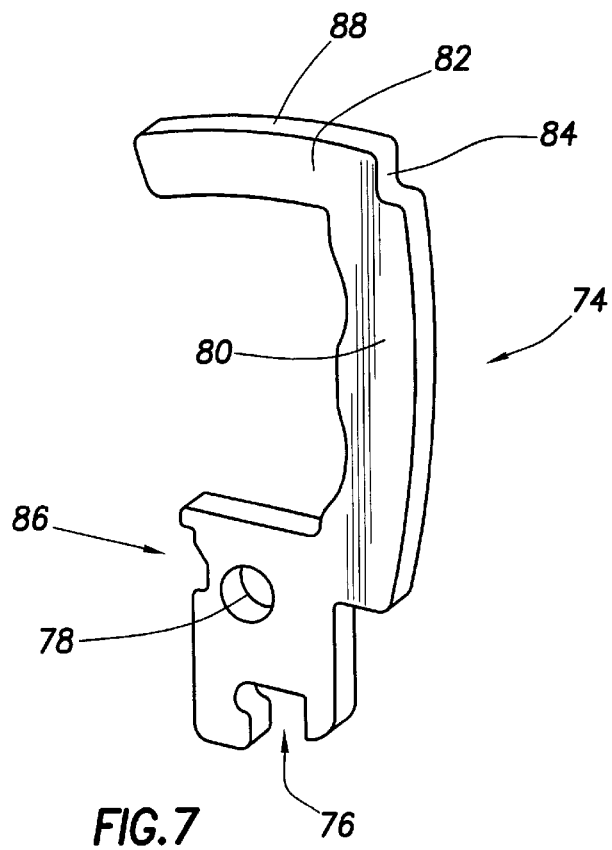
FIG. 7 shows a perspective view of the ejectable pull handle of the preferred embodiment.

Referring now to FIG. 7, there is shown an ejectable pull handle 74 of the preferred embodiment. The ejectable pull handle 74 preferably comprises a rack hook 76. This rack hook is adapted to catch on a mating portion of the rack (now shown) and become the force application point for insertion and removal of the electronic device 2 from the rack 20A–D. The ejectable pull handle also comprises an aperture 78 which is preferably the pivot point or point of rotation for the ejectable pull handle 74 generally. That is, the ejectable pull handle is preferably rotatably mounted to the electronic device 2 by some mechanism through this aperture 78. The ejectable pull handle 74 also comprises a handle 80 which is the location on the ejectable pull handle 74 that an operator or technician applies force to gain mechanical advantage in the insertion and removal of the electronic device 2.

During the insertion process, it is necessary that the ejectable pull handle displace the latching head 32 of the insertion latch 30. Once the ejectable pull handle 74 has seated the electronic device and has been pushed to a latching position, the latching head 32 of the insertion latch 30 preferably drops to its rest or latch position, thus mating with the latch area 84.

The ejectable pull handle 74 of the preferred embodiment also comprises a force application surface 86. The force application surface 86 is preferably an inclined shape and is the force application location for force supplied by the leaf spring 62. In particular, the force application point 72 of the leaf spring 62 preferably contacts the force application surface 86. When the ejectable pull handle 74 is in the latched position, the leaf spring 62 preferably biases the ejectable pull handle towards an intermediate position by resting on a surface substantially perpendicular to the direction of the spring force. As an operator or technician displaces the latching head 32, force supplied by the leaf spring 62 acting on the force application surface 86 preferably pushes the ejectable pull handle out to an intermediate position where the operator or technician can thus grab the handle 80 and rotate the ejectable pull handle 74 to provide the mechanical advantage to remove the electronic device 2 from the rack 20A–D. The force application surface 86 is preferably an inclined shaped such that the force applied by the spring 62 is substantially tangential to the point of rotation whether the handle is in the latched position or in the intermediate position.

Figure 8:
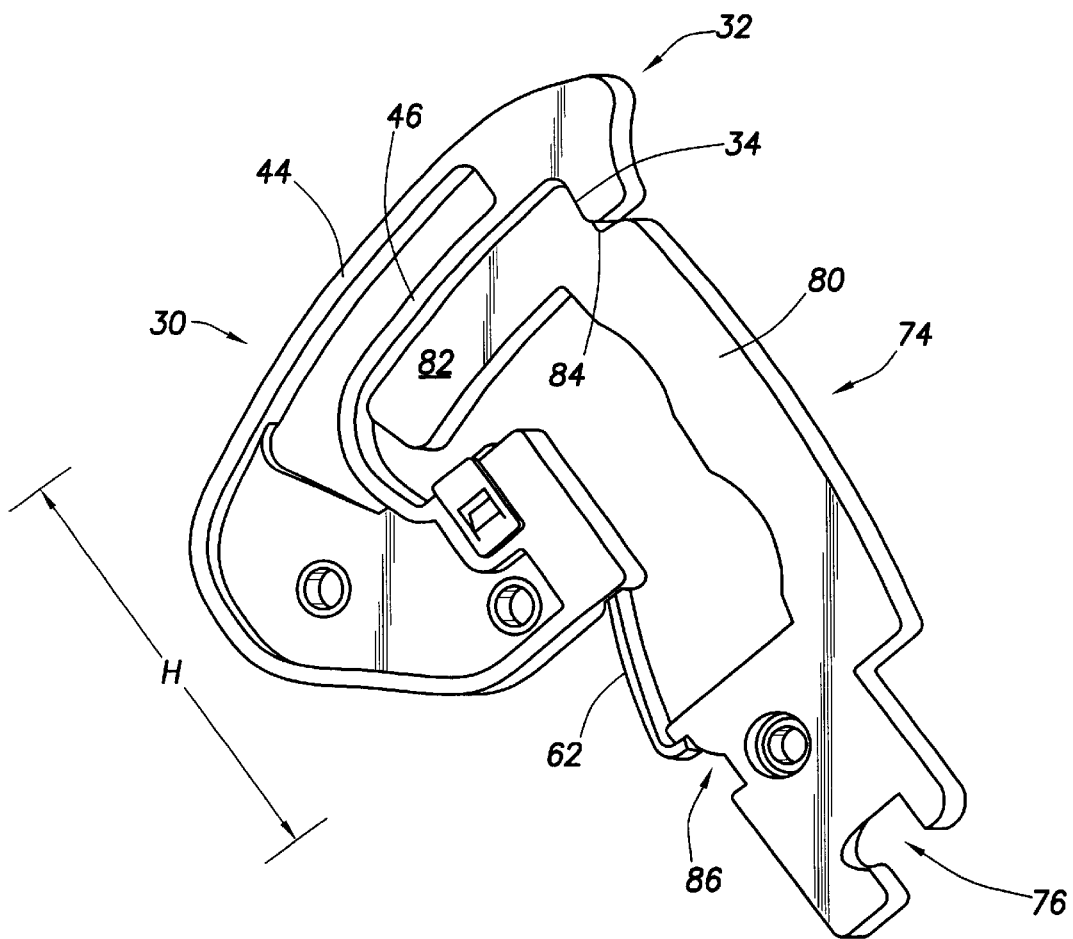
FIG. 8 shows a perspective view of a combination of the insertion latch and ejectable pull handle of the preferred embodiment.

Referring now to FIG. 8, there is shown the insertion latch 30 and ejectable pull handle 74 together in their latched position. In the latched position, the latching head 32, in particular the latching face 34, couples to the latch area 84 to hold the ejectable pull handle 74 in the latched position. Also in this latched position, the leaf spring 62 slideably contacts the force application surface 86, thus biasing the ejectable pull handle 74 toward the intermediate position.

Still referring to FIG. 8, in operation, an operator or technician displaces by manual force the latching head 32 until the latching face 34 no longer couples with the latch area 84 (see FIG. 5 dotted lines). Once the latching head 32 is raised sufficiently, the ejectable pull handle 74 springs out to an intermediate position, pushed at least in part by the force applied by the leaf spring 62 to the force application surface 86. Once in this intermediate position, the latching head 32 sits on an upper surface 88 (FIG. 7) of the displacement arm 82. The operator or technician provides the necessary rotational force to remove the electronic device.

Insertion is substantially the opposite procedure of the removal. In particular, the electronic device 2 is placed into the rack 20A–D until a rack hook 76 of the ejectable pull handle 74 meets with a mating portion on the rack (not shown). Once in this mating position, an operator or technician pushes the handle portion 80 of the ejectable pull handle 74, thus obtaining mechanical advantage in the insertion of the electronic device 2. At some point in the rotation of the ejectable pull handle 74, the displacement arm 82 contacts the latching head 32 and displaces that latching head 32. More particularly, during the insertion process, the latching head 32 rides on the upper surface of the displacement arm 88 until the ejectable pull handle 74 is pushed sufficiently that the latching head 32 moves to its rest or latched position with force supplied by the compression member 44 and attention member 46. Likewise, the process of latching the ejectable pull handle to the insertion latch 30 biases the leaf spring 62 to provide force to eject that handle during the next removal procedure.

In the preferred embodiment, the insertion latch 30 is preferably made of a plastic material. In particular, the insertion latch is preferably made from polycarbonate acrylonitrile butadiene styrene ("PCABS"). This particular plastic may be purchased commercially under trade names Cycolac®, Magnum®, and Lustran®. It is envisioned that the insertion latch 30 will be milled from a solid piece of the PCABS. However, the insertion latch 30 could likewise be produced by molding. The ejectable pull handle 74 is preferably made of metal having sufficient strength for the forces created in the insertion and removal process. Likewise, the leaf spring is preferably made of stainless steel, in particular 17-7 PH stainless steel heat treated to condition C. This type of stainless and heat treatment is necessary for the leaf spring to retain its relaxed position memory, as it is envisioned that this leaf spring may be in its charged state for many months or years between operations.

Thus, it is seen that the preferred embodiment of the insertion latch 30 and ejectable pull handle 40 have a minimum number of moving components and may be easily replaced or repaired without the worries of placement of a plurality of moving parts, or charging coil springs.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A latching system for insertion coupled rack mounted electronic devices, the latching system comprising:

an ejectable pull handle having a rack hook, an aperture being a point of rotation, and a handle, the ejectable pull handle adapted to provide mechanical advantage in the insertion and removal of an electronic device; and an insertion latch adapted to hold the ejectable pull handle in a latched position when the electronic device is in an inserted position, and wherein the insertion latch further comprises:

a mounting portion adapted to be securely attached to the electronic device;

a latching head adapted to hold the ejectable pull handle in the inserted position;

a compression member connecting the latching head to the mounting portion;

a tension member connecting the latching head to the mounting portion; and wherein when the latching head is displaced from a rest position to release the ejectable pull handle, the tension member has tension placed thereon and the compression member is compressed, and a combination of forces supplied by the compression member and the tension member act to return the latching head to the rest position after a displacing force has been removed.

2. The latching system for insertion coupled rack mounted electronic devices as defined in claim 1 further comprising:

a force application surface offset from the point of rotation of the ejectable pull handle, the force application surface adapted to direct a force applied thereto substantially tangential to the point of rotation; and a leaf spring attached to the insertion latch contacting the force application surface, the leaf spring adapted to apply force to said force application surface.

3. The latching system for insertion coupled rack mounted electronic devices as defined in claim 2 further comprising:

a channel on a first side of the mounting portion of the insertion latch, walls of the channel substantially perpendicular to a plane formed by the insertion latch, and wherein the channel has a width larger than a thickness of the leaf spring;

a spring retention indentation on a second side of the mounting portion proximate to the channel; and said leaf spring adapted to fit within the channel, and the leaf spring also having a tab adapted to mate with the spring retention indentation to lock the leaf spring in place.

4. The latching system for insertion coupled rack mounted electronic devices as defined in claim 2 wherein the force application surface of the ejectable pull handle further comprises an inclined shape which forces maximum displacement of the leaf spring when the ejectable pull handle is in the latched position.

5. The latching system for insertion coupled rack mounted electronic devices as defined in claim 2 wherein the leaf spring is made of stainless steel.

6. The latching system for insertion coupled rack mounted electronic devices as defined in claim 5 wherein the leaf spring further comprises heat treated 17-7 PH stainless steel.

7. The latching system for insertion coupled rack mounted electronic devices as defined in claim 1 wherein the insertion latch further comprises:

said compression member having a rectangular cross-section and a curvature with a radius at least as great as the height of the insertion latch; and said tension member having a rectangular cross-section, and also having a first section proximate to the latching head having a curvature with a radius of curvature substantially the same as the compression member, and wherein the tension member also having a second section proximate to the mounting portion having a curvature smaller than that of the first section.

8. The latching system for insertion coupled rack mounted electronic devices as defined in claim 7 wherein the insertion latch is constructed of plastic.

9. The latching system for insertion coupled rack mounted electronic devices as defined in claim 8 wherein the insertion latch is constructed of polycarbonate acrylonitrite butadiene styrene.

10. The method of insertion of a computer in a rack mounted computer systems, the method comprising:

rotating an ejectable pull handle toward a latched position;

displacing a latch portion of an insertion latch with a displacement arm of the ejectable pull handle during the rotating step; and thereby compressing a compression member of the insertion latch as the latch portion is displaced by the displacement arm;

tensioning a tension member of the insertion latch as the latch portion is displaced by the displacement arm; and moving the latching head into a latched position with the ejectable pull handle by application of restoring forces supplied by the compression member and tension member when the displacement arm of the ejectable pull handle passes a latching head of the insertion latch.

11. The method of insertion of a computer in a rack mounted computer systems as defined in claim 10 wherein during the rotating step the method further comprises:

displacing a leaf spring connected to a stationary portion of the insertion latch; and therewith applying force to a force application location, the force tending to bias the ejectable pull handle away from the latched position.

12. An insertion latch for latching an ejectable pull handle for a rack mounted electronic device, the insertion latch comprising:

a mounting portion rigidly attached to the electronic device;

a flexible arm attached to the mounting portion;

a latching head having a latching face substantially perpendicular to the flexible arm; and wherein the flexible arm further comprises:

a compression member spanning the mounting portion and the latching head;

a tension member spanning the mounting portion and the latching head; and wherein displacement of the latching head compresses the compression member and tensions to tension member, and a combination of forces supplied by the compression member and tension member return the latching head to a rest position after a displacing force has been removed.

13. The insertion latch for latching an ejectable pull handle for a rack mounted electronic device as defined in claim 12 further comprising:

a leaf spring channel on a side of the insertion latch, a channel portion of the leaf spring channel approximately parallel to the latching face of the flexible arm;

a spring retention cavity on a side opposite that of the leaf spring channel; and a leaf spring assembly having a spring portion extending through the leaf spring channel, and also having a retention portion having a tab thereon within the cavity.

14. The insertion latch for latching an ejectable pull handle for a rack mounted electronic device as defined in claim 13 wherein the leaf spring is made of stainless steel.

15. The insertion latch for latching an ejectable pull handle for a rack mounted electronic device as defined in claim 14 wherein the leaf spring further comprises heat treated 17-7 PH stainless steel.

16. The insertion latch for latching an ejectable pull handle for a rack mounted electronic device as defined in claim 12 wherein the insertion latch further comprises:
    said compression member having a rectangular cross-section and a curvature with a radius at least as great as the height of the insertion latch; and
    said tension member having a rectangular cross-section, and also having a first section proximate to the latching head having a curvature with a radius of curvature substantially the same as the compression member, and wherein the tension member also having a second section proximate to the mounting portion having a curvature smaller than that of the first section.

17. The insertion latch for latching an ejectable pull handle for a rack mounted electronic device as defined in claim 16 wherein the insertion latch is constructed of plastic.

18. The insertion latch for latching an ejectable pull handle for a rack mounted electronic device as defined in claim 17 wherein the insertion latch is constructed of polycarbonate acrylonitrite butadiene styrene.

19. A method of removing a computer from a rack mounted system, the method comprising:
    displacing the latching head of an insertion latch out of a latched position, the latching head in a latched position with a latching portion of an ejectable pull handle;
    compressing a compression member of the insertion latch;
    tensioning a tension member of the insertion latch;
    allowing the ejectable pull handle to move to an intermediate position;
    rotating the ejectable pull handle to remove the computer system from the rack; and
    allowing the latching head of the ejectable pull handle to return to a rest position under force supplied by the tension member and the compression member.

20. The method of removing a computer from a rack mounted system as defined in claim 19 wherein allowing the ejectable pull handle to move to an intermediate position further comprises biasing the ejectable pull handle toward the intermediate position with a leaf spring rigidly attached to the insertion latch and slidably contacting the ejectable pull handle.

21. The method of removing a computer from a rack mounted system as defined in claim 19 wherein displacing the latching head further comprises pushing on the latching head of the insertion latch.

22. A latching system for computers in rack mounted systems, the latching system comprising:
    an ejectable pull handle means for providing mechanical advantage in the insertion and removal of an electronic device; and
    an insertion latch means for holding the ejectable pull handle in a latched position when the electronic device is in an inserted position, and wherein the insertion latch means further comprises:
    a mounting means securely attached to the electronic device, the mounting means for securely holding the insertion latch to the electronic device;
    a latching head means for holding the ejectable pull handle means in the inserted position;
    a compression member means for converting displacement of the latching head means into stored compressional energy, the compression member means connecting the latching head means to the mounting means;
    a tension member means for converting displacement of the latching head means into stored tensional energy, the tension member means connecting the latching head to the mounting means; and
    wherein when the latching head means is displaced from a rest position to release the ejectable pull handle means, a combination of forces supplied by the compression member means and the tension member means act to return the latching head to the rest position after a displacing force has been removed.

23. The latching system for computers in a rack mounted system as defined in claim 22 further comprising:
    said ejectable pull handle means having an aperture being a point of rotation of the ejectable pull handle means;
    a force application means offset from the point of rotation, the force application means for directing a force applied thereto substantially tangential to the point of rotation; and
    a leaf spring means attached to the insertion latch means contacting the force application means, the leaf spring means for applying force to the force application means.

24. The latching system for computers in rack mounted systems as defined in claim 23 further comprising:
    a channel on a first side of the mounting means of the insertion latch means, walls of the channel substantially perpendicular to a plane formed by the insertion latch means, and wherein the channel has a width larger than a thickness of the leaf spring means;
    a spring retention means on a second side of the mounting portion proximate to the channel, the spring retention means for holding the leaf spring means securely to the insertion latch means; and
    said leaf spring means adapted to fit within the channel, and the leaf spring means also having a tab adapted to mate with the spring retention means to lock the leaf spring in place.

25. The latching system for computers in a rack mounted system as defined in claim 23 wherein the force application surface of the ejectable pull handle means further comprises an inclined shaped which forces maximum displacement of the leaf spring means when the ejectable pull handle means is in the latched position.

26. The latching system for computers in a rack mounted system as defined in claim 23 wherein the leaf spring means is made of stainless steel.

27. The latching system for computers in a rack mounted system as defined in claim 26 wherein the leaf spring means comprises heat treated 17-7 PH stainless steel.

28. The latching system for computers in a rack mounted system as defined in claim 22 wherein the insertion latch means further comprises:
    said compression member means having a rectangular cross-section and a curvature with a radius at least as great as the height of the insertion latch means; and
    said tension member means having a rectangular cross-section, and also having a first section proximate to the latching head means having a curvature with a radius of curvature substantially the same as the compression member, and wherein the tension member means also having a second section proximate to the mounting means having a curvature smaller than that of the first section.

29. The latching system for computers in a rack mounted system as defined in claim 28 wherein the insertion latch means is constructed of plastic.

30. The latching system for computers in a rack mounted system as defined in claim 29 wherein the insertion latch means is constructed of polycarbonate acrylonitrite butadiene styrene.

\* \* \* \* \*